United States Patent

Li et al.

[11] Patent Number: 5,912,571
[45] Date of Patent: Jun. 15, 1999

[54] USING THE INTERNAL SUPPLY VOLTAGE RAMP RATE TO PREVENT PREMATURE ENABLING OF A DEVICE DURING POWER-UP

[75] Inventors: Li-Chun Li, Los Gatos; Lawrence C. Liu, Menlo Park, both of Calif.; Michael A. Murray, Bellevue, Wash.

[73] Assignee: Mosel Vitelic Corporation, San Jose, Calif.

[21] Appl. No.: 08/947,776

[22] Filed: Oct. 9, 1997

[51] Int. Cl.[6] .................................................. H03L 7/00
[52] U.S. Cl. ............................................. 327/143; 327/198
[58] Field of Search .................................. 327/142, 143, 327/198

[56] References Cited

U.S. PATENT DOCUMENTS

| | | | |
|---|---|---|---|
| 4,210,829 | 7/1980 | Wong et al. | 327/143 |
| 4,367,422 | 1/1983 | Leslie | 327/143 |
| 4,536,667 | 8/1985 | Masuda | 327/143 |
| 4,607,178 | 8/1986 | Sugie et al. | 327/143 |
| 4,886,984 | 12/1989 | Nakaoka | 327/143 |
| 5,519,347 | 5/1996 | Kim | 327/143 |
| 5,696,979 | 12/1997 | Saitou | 327/143 |
| 5,703,510 | 12/1997 | Iketani et al. | 327/143 |
| 5,703,512 | 12/1997 | McClure | 327/143 |
| 5,721,502 | 2/1998 | Thomson et al. | 327/143 |
| 5,770,959 | 6/1998 | Hopkins et al. | 327/143 |
| 5,818,286 | 10/1998 | Watanabe | 327/143 |

*Primary Examiner*—Timothy P. Callahan
*Assistant Examiner*—Jeffrey Zweizig
*Attorney, Agent, or Firm*—Skjerven Morril MacPhearson Franklin & Friel LLP; Michael Shenker

[57] ABSTRACT

A semiconductor device disables itself during power-up until the internal power supply voltage and other circuits reach states in which the device can operate properly. The internal power supply voltage is coupled to the input terminal of an inverter through a delay network. During power-up, the device remains disabled until the voltage at the input terminal of the inverter reaches the inverter trip point. The delay network and the inverter are designed so that the voltage at the inverter's input terminal does not reach the inverter trip point until the internal power supply voltage and other circuits have reached states in which the device can operate properly. When the (device is turned off, the inverter input terminal is discharged quickly by a diode or resistor. Therefore, if the power is turned back on immediately, a suitable delay will be provided.

2 Claims, 4 Drawing Sheets

USING THE INTERNAL SUPPLY VOLTAGE RAMP RATE TO PREVENT PREMATURE ENABLING OF A DEVICE DURING POWER-UP

BACKGROUND

1. Field of the Invention

The present invention relates to semiconductor circuits, and more particularly to power-up circuits.

2. Description of Related Art

A common goal in circuit design is to ensure that the circuit powers up in the proper state. Power supply lines are routed to different parts of the circuit, and thus possess parasitic capacitance.

Therefore, upon power-up, it takes a certain amount of time for the power supply lines to reach the final supply voltage level. If the circuit is activated before the supply lines reach a high enough voltage level, sensitive circuits, such as latches, may assume an incorrect state, and also failures such as latch-up can occur.

These concerns become even greater with devices in which an externally provided supply voltage is converted to an internal supply voltage. Semiconductor devices offering low power consumption as an option are such devices. For example, many 5V devices offering low power as an option, convert the externally provided 5V supply to an internal supply voltage of 3.3V, which voltage is provided to internal circuits via the internal supply lines.

In such devices, the voltage converter that converts the 5V voltage to 3.3V consumes static power. The amount of power consumed is proportional to how rapidly the voltage on the internal supply lines needs to be raised upon power-up. The faster the rise time, the higher is the static power consumption. High static power consumption can be prohibitive in low power devices.

Therefore, voltage converters in many low power devices consume little static power at the expense of slower internal supply voltage rise time. The internal supply voltage rise time can be especially slow in larger devices wherein the parasitic capacitance of the internal supply lines is large. With such slow rise time, activating the device before the internal circuits have stabilized and assumed proper states can cause the device to power-up in a faulty state. Further, premature activation of circuits can lead to device failures due to latch-up.

Problems related to premature device activation have been addressed by device specifications stating that the device can be enabled only a certain period of time after power is turned on. Usually, the time period is a conservative estimate of the time it takes for the internal supply lines to reach the final voltage level.

However, in many systems using a single power supply, for example in personal computers, implementation of the chip enable timing can be difficult or impossible since the chip enable signal is generated by a circuit which itself needs time to power up before it can reliably provide the chip enable signal.

SUMMARY

In accordance with the present invention, a circuit having an internal power supply line for carrying a supply voltage disables itself during power-up until the circuit is operational. Therefore, in some embodiments premature circuit activation is precluded. Further, in some embodiments, signals that put latches in a predetermined state upon power-up are delayed until the latches can be placed in that state reliably. In some embodiments, the circuit disables itself until the latches are set in their correct states, bias voltages are developed, and the circuit is ready for reliable operation.

In some embodiments, the circuit is disabled during power-up by an internal chip enable signal ICE. Signal ICE is generated reliably during power-up as follows. The internal power supply voltage IVCC is coupled to the input terminal of an inverter through a delay network. The IVCC is also coupled directly to the inverter's power supply terminal. Thus, during power-up, the inverter's power supply terminal rises with the internal power supply voltage, and the inverter's input terminal also rises but is delayed. The delay network and the inverter are designed so that the signal at the inverter's input terminal does not reach the inverter trip point until the internal power supply and other internal circuits have reached a state in which the circuit is operational. Before that time, the signal at the inverter's output terminal follows IVCC because the signal at the inverter's input terminal is below the inverter's trip point. The signal at the output terminal drives an IVCC-powered logic gate. The output terminal of the logic gate is held reliably low until the signal at the input terminal of the inverter reaches the inverter's trip point. The low signal at the output terminal of the logic gate disables the circuit.

In some embodiments, a diode or a resistor is used to quickly discharge the inverter input terminal when the power is turned off. Therefore, if the power is turned off and then turned immediately back on, the inverter input terminal will discharge upon power-down and will then properly be delayed upon power-up, providing a suitable delay in enabling the circuit.

The invention is not limited to inverters or any other particular circuit. Other features and advantages of the invention will become more apparent from the following description and the accompanying drawings.

DETAILED DESCRIPTION

Figure 1:
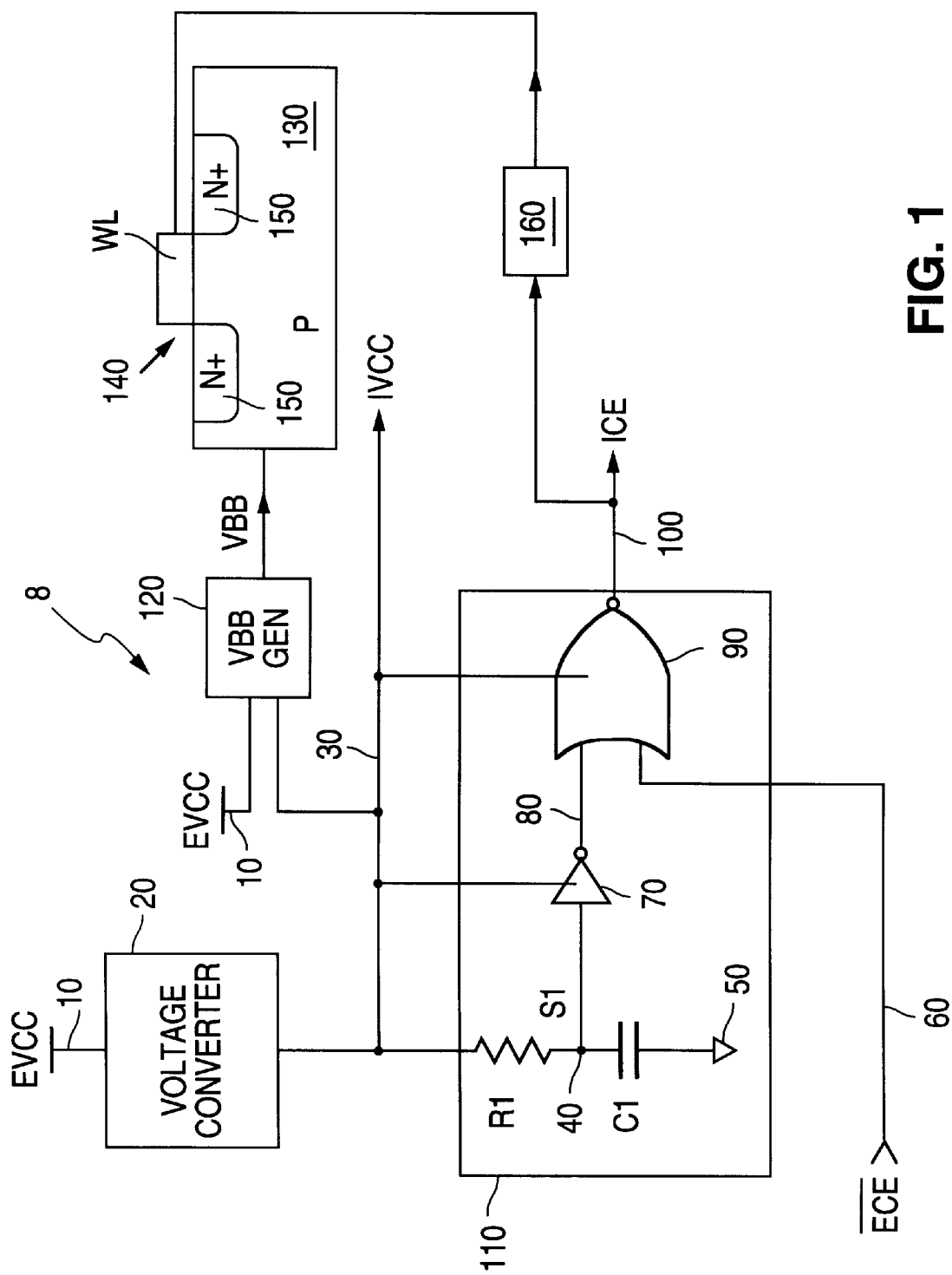
FIG. 1 is a circuit diagram of a portion of a circuit in accordance with the present invention.

FIG. 1 shows a circuit 8 having a power-up circuit 110 which generates an internal chip enable signal ICE. This signal enables a semiconductor device in which circuit 8 is housed.

As shown, an external supply voltage EVCC is received on an input lead 10. A voltage converter 20 converts the EVCC voltage to an internal supply voltage IVCC at lead 30. IVCC provides the supply voltage to circuits inside the device.

Resistor R1 connected between IVCC and node 40, and capacitor C1 connected between node 40 and ground terminal 50, form an RC network. This RC network delays the signal S1 on node 40 relative to IVCC. The input terminal of inverter 70 is connected to node 40, and its output terminal is connected to input terminal 80 of NOR gate 90.

The other input terminal 60 of NOR gate 90 receives the active low external chip enable signal $\overline{ECE}$. NOR gate 90 provides the active high internal chip enable signal ICE on output lead 100. The NOR gate 90 and inverter 70 are CMOS circuits powered by IVCC.

The device that houses circuit 8 is placed in stand-by or inactive mode when ICE is low. In this mode the device may not be accessed for any operation. The device is placed in active mode when ICE is asserted high, in which case the device can be accessed for normal operation. When either the input terminal 80 of the NOR gate 90 or the $\overline{ECE}$ signal is high, ICE is forced low.

As explained in more detail below, upon power-up, the signal on node 80 forces ICE low (i.e., disables the device) until the internal supply voltage IVCC and other voltages (including substrate bias voltage VBB) have reached levels at which the device is operational. In particular, FIG. 1 shows substrate bias generator 120 generating the negative voltage VBB to bias a P-type substrate or region 130. Region 130 contains one or more NMOS transistors 140. In some embodiments, circuit 8 is a dynamic random access memory (DRAM), and transistors 140 are pass transistors of the memory cells, as known in the art. One of the N+ source/drain regions 150 of each transistor 140 is connected to a bit line (not shown), and the other source/drain region 150 is connected to a capacitor (not shown), as known in the art. The gates of transistors 140 are connected to word lines WL. The word lines WL are driven by row decoder circuit 160 which is enabled by the ICE signal. Of note, in some DRAMs, the external chip enable signal $\overline{ECE}$ is row address strobe $\overline{RAS}$ signal.

VBB generator 120 receives power from the external supply voltage EVCC, or the internal supply voltage IVCC, or both. See, for example, U.S. patent application Ser. No. 08/853,291 entitled "Generation of Signals from Other Signals that Take Time to Develop on Power-Up" filed by L. Liu et al. on May 9, 1997 and incorporated herein by reference.

On power-up, it takes time for the bias voltage VBB to become sufficiently negative to reduce the leakage of transistors 140 to an acceptable value (the leakage can result in loss of information in the memory cell). Further, when a word line WL is driven high during a memory access, the voltage of region 130 increases due to capacitive coupling between the wordline WL and the substrate 130. If this occurs before VBB becomes sufficiently negative, a PN junction formed by region 130 and a source/drain region 150 can get forward biased, causing a latch-up. A properly designed delay in asserting the ICE signal prevents the memory from being used before the VBB reaches an acceptable negative value, thus avoiding cell Leakage and preventing latch-up.

Figure 2:
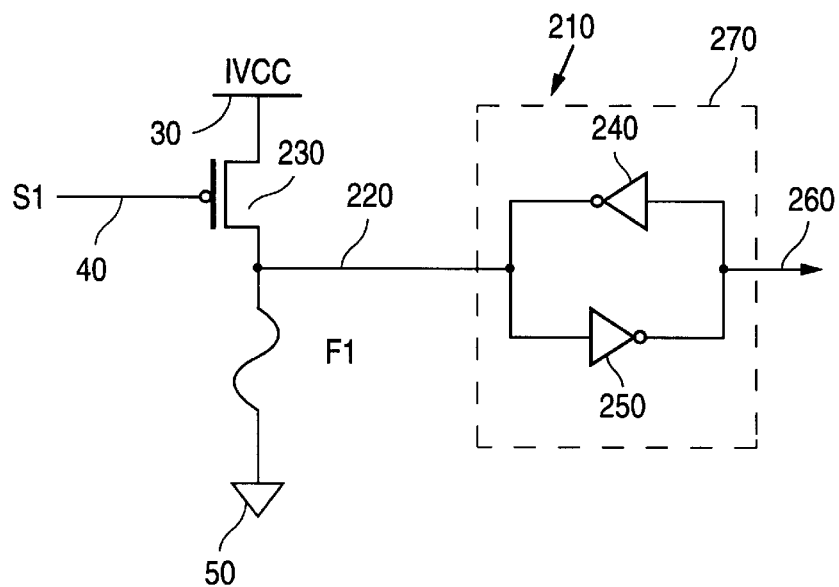
FIG. 2 is a circuit diagram of another portion of the same circuit.

FIG. 2 shows a circuit 210 used in some memories to provide fuse options. Fuse F1 is connected between ground terminal 50 and a node 220. PMOS transistor 230 is connected between node 220 and the internal supply voltage IVCC (or EVCC in some embodiments). Inverters 240 and 250 are connected in a cross-coupled formation wherein, node 220 is connected to the output terminal of inverter 240 and the input terminal of inverter 250, and node 260 is connected to the output terminal of inverter 250 and the input terminal of inverter 240.

The state of the latch 270 formed by inverters 240 and 250 depends on whether the fuse F1 is blown. If fuse F1 is blown, transistor 230 pulls node 220 up, causing node 260 to go low. If fuse F1 is intact, the fuse overpowers transistor 230 and pulls node 220 low, causing node 260 to go high.

Circuits like 210 are used in memory redundancy circuits, in memory salvage circuits, or to adjust a circuit to particular operating conditions, for example, to a particular external supply voltage level.

In FIG. 2, the gate of transistor 230 is connected to node 40. Therefore, during power-up transistor 230 is on since the signal S1 on node 40 is delayed relative to IVCC such that the signal S1 is below IVCC by at least the threshold voltage of transistor 230 (1V in some embodiments). Therefore, transistor 230 is on during power-up and turns off when the voltage difference between signal S1 and IVCC becomes less than the threshold voltage of transistor 230 (e.g., when signal S1 becomes equal to IVCC). Turning off transistor 230 saves power if the fuse F1 is intact.

In the case of fuse F1 being blown, in order for the latch 270 to be reliably set into the correct state, transistor 230 has to be on at least until inverters 240 and 250 are powered up. Further, transistor 230 has to remain on for a while after the inverters are powered up to allow the voltage at node 220 to drive the inverters into the proper state. In some embodiments, the signal S1 is delayed relative to IVCC such that transistor 230 is on sufficiently long to drive the latch 270 into the proper state.

Figure 3:
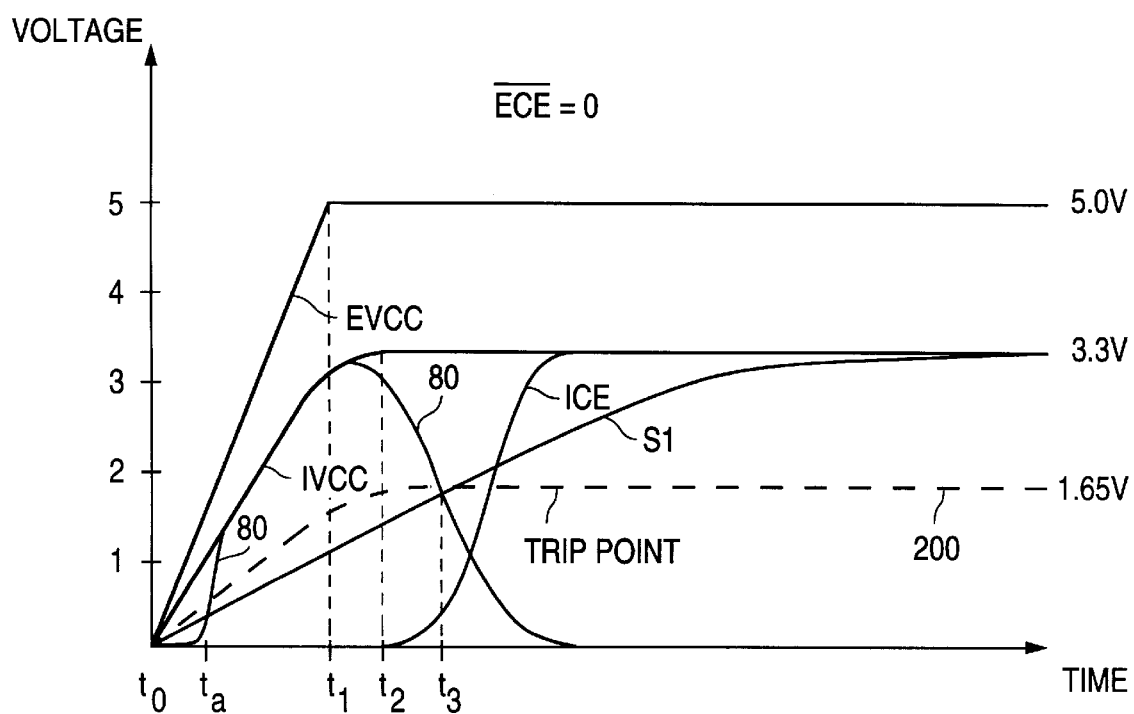
FIG. 3 is a timing diagram of signals in the circuit of FIG. 1.

The operation of circuit 8 in FIG. 1 during power-up is illustrated in the timing diagram of FIG. 3. The ramp rates and voltage levels illustrate one embodiment of circuit 8 and are not intended to be limiting.

As shown, the external supply voltage EVCC is ramped up from 0V at time $t_0$ to 5V at time $t_1$. In response, the internal supply voltage IVCC rises from 0V at time $t_0$ to 3.3V at time $t_2$ (assuming the voltage converter 20 converts EVCC of 5V to IVCC of 3.3V.) The rate at which IVCC rises depends upon the design of the voltage converter circuit 20 and the size of parasitic capacitance on lead 30.

As mentioned earlier, depending on the size of the parasitic capacitance on lead 30, faster IVCC rise times can be obtained at the expense of higher static power consumption by converter 20. Usually, a trade-off is made based on the requirements and goals of each specific design.

In this embodiment, the trip point of inverter 70 is set to one half of the supply voltage (i.e., ½ of IVCC or 1.65V when IVCC is at 3.3V.) The dashed line 200 in FIG. 3 indicates the trip point of the inverter 70. Trip point 200 is at the mid-level between IVCC and 0V at all times.

When IVCC starts rising at time $t_0$, signal S1 also rises, but with a time delay corresponding to the RC time constant associated with the R1/C1 network. The RC time constant is such that signal S1 crosses the trip point of inverter 70 (at time $t_3$) after IVCC has reached its final voltage level of 3.3V (at time $t_2$.) In this manner, sufficient time is provided for all the circuits to power up and stabilize prior to enabling of the device. The device can be enable earlier or later in time by properly adjusting the trip point of inverter 70, or selecting proper values for R1 and C1, or both.

Figure 4:
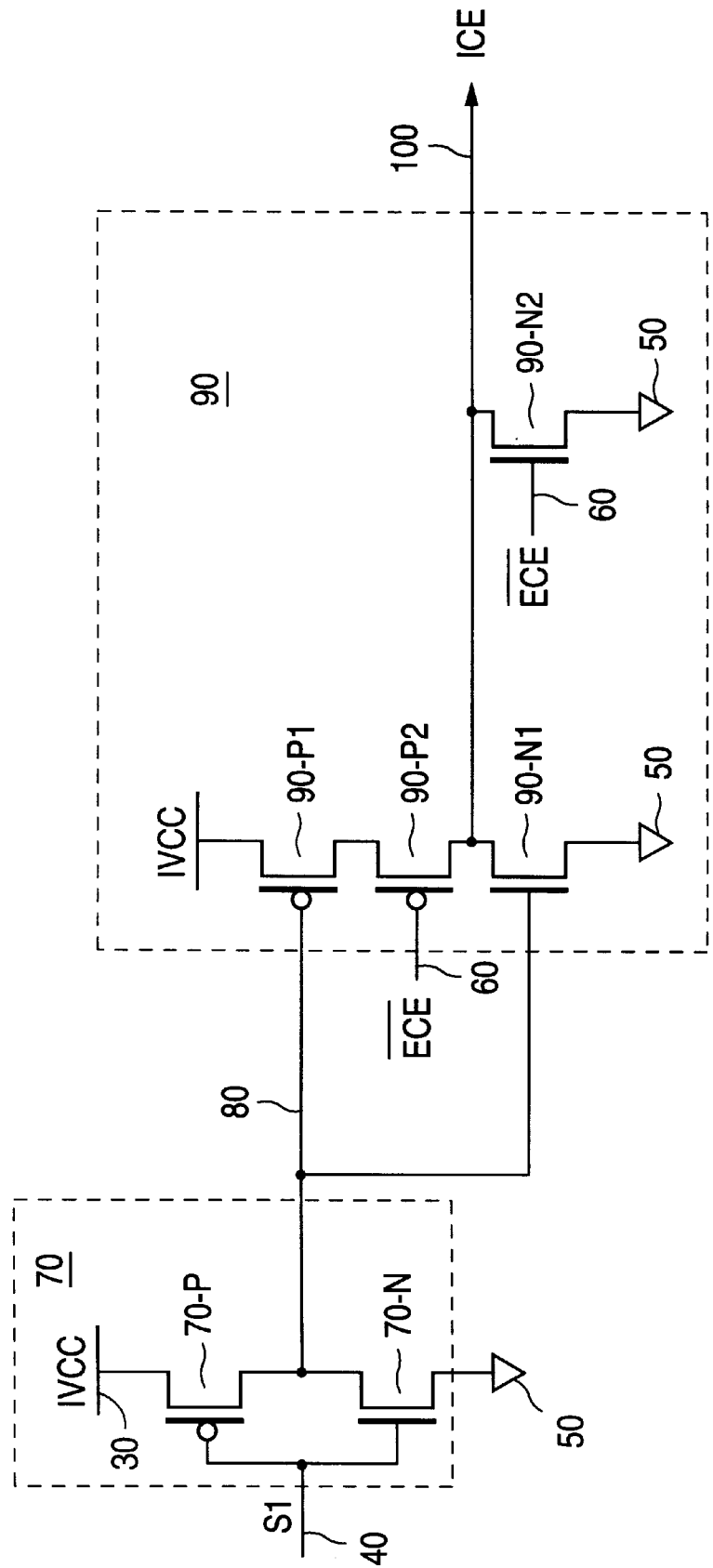
FIG. 4 is a transistor-level diagram of a portion of the circuit of FIG. 1.

FIG. 4 illustrates the transistor-level diagram of CMOS inverter 70 and CMOS NOR gate 90. Inverter 70 includes PMOS transistor 70-P and NMOS transistor 70-N. NOR gate 90 includes: (1) PMOS transistor 90-P1 and NMOS transistor 90-N1 whose gates are connected to node 80; and (2) PMOS transistor 90-P2 and NMOS transistor 90-N2 whose gates are connected to the $\overline{ECE}$ node 60.

When the power is turned on, the delay provided by resistor R1 and capacitor C1 is such that when IVCC reaches the threshold voltage of transistor 70-P, node 40 is still almost at 0V. Thus, transistors 70-P and 90-P1, which have the same threshold voltage, turn on when IVCC reaches the threshold voltage of the two transistors at time $t_a$. When transistor 70-P turns on, it pulls node 80 up to IVCC, turning off transistor 90-P1. Since transistor 90-P1 may turn on only momentarily, and since during this time IVCC is fairly low, ICE remains low (if $\overline{\text{ECE}}$ is low).

As indicated in FIG. 3, $\overline{\text{ECE}}$ is at 0V at all times. Thus, at time $t_3$ when signal S1 rises above the trip point 200 of inverter 70, the voltage at lead 80 goes low which causes the ICE signal to go high, thereby enabling the device.

Figure 5:
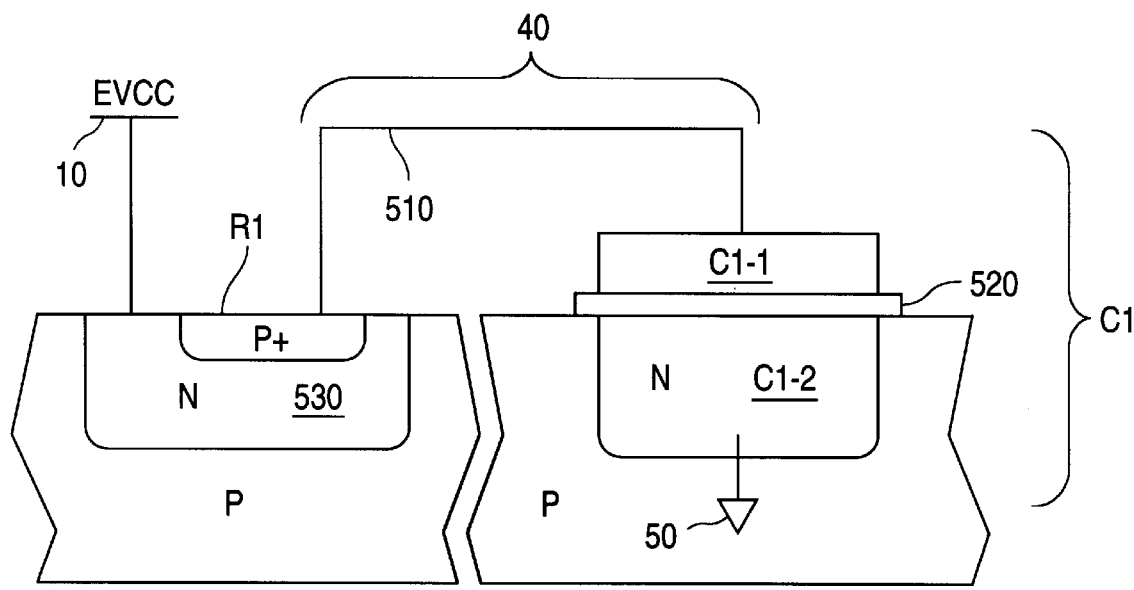
FIGS. 5 and 6 diagram some power-down circuits used with the circuit of FIG. 1.

If the power to the device is turned off and then is rapidly turned on, node 40 may not discharge due to the large time delay associated with R1 and C1 (R1 is 1 or 2 mega-ohms in some embodiments). If node 40 is not sufficiently discharged before the power is turned back on, node 80 remains low causing ICE to remain high. In this manner, the R1/C1 network becomes ineffective. Therefore, in some embodiments an additional discharge path is provided to quickly discharge node 40 when the power is turned off. In FIG. 5, the additional discharge path is a diode. More particularly, resistor R1 is a P+ diffusion region formed in an N or N+ well region 530 biased by EVCC. In some embodiments, N well region 530 is biased by IVCC rather than EVCC. Resistor R1 is connected to plate C1-1 of capacitor C1 by a metal line 510. Plate C1-1 is manufactured like a transistor gate. The other plate C1-2 of capacitor C1 is a N-region isolated from plate C1-1 by silicon dioxide 520 as known in the art.

When the power is turned off, terminal 10 is quickly driven to 0V. With node 40 remaining substantially high, the PN junction formed by the P+ junction (resistor R1) and N well region 530 becomes forward biased and helps discharge node 40 to about 0.65V, that is, the voltage at which the PN junction diode turns off.

Figure 6:
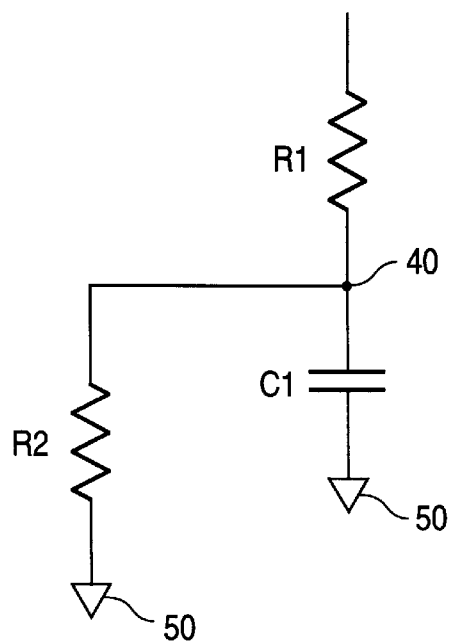

In FIG. 6, node 40 is discharged by a resistor R2. Resistor R2 is connected between node 40 and ground terminal 50. Resistor R2 is much larger than R1 so that (i) during power-up the resistor R2 does not interfere with the charging of node 40, and (ii) consumes an insignificant amount of static current. In some embodiments, resistor R2 is two to ten times larger than resistor R1. In some embodiments, the resistor R2 is implemented by a weak transistor ("leaker" transistor).

The invention is not limited by the embodiments described above. In particular, the invention is not limited by any particular circuits, voltage levels, or timing parameters. In some embodiments, inverter 70 and NOR gate 90 are powered by EVCC rather than IVCC. Some embodiments use antifuse as programmable elements instead, or in addition to, fuses. The invention is not limited to circuits having latches or bias generators. Other embodiments, variations and modifications are within the scope of the invention as defined by the appended claims.

What is claimed is:

1. A circuit C comprising:

a voltage converter for converting an externally provided supply voltage to an internal supply voltage that powers at least a portion of circuit C;

a power-up circuit C1 for generating a signal CE to enable the circuit C, the circuit C1 delaying the signal CE at least until the circuit C is operational, wherein the circuit C1 is powered by the internal supply voltage, circuit C1 comprising:

a delay circuit for delaying a signal S1 on a node relative to the internal supply voltage, the delay circuit comprising a resistor/capacitor circuit coupled to the internal supply voltage and the node, the resistor comprising a first semiconductor region of a first conductivity type forming a PN junction with a second semiconductor region of a second conductivity type, the second semiconductor region receiving the external supply voltage; and a circuit C2 for generating the signal CE when the signal S1 reaches a predesignated voltage level.

2. A method for enabling a circuit C at power-up, comprising:

(a) converting an externally provided supply voltage to an internal supply voltage;

(b) generating a signal CE for enabling the circuit C, wherein the signal CE is delayed at least until the circuit C is operational, step (b) comprising:

(c) generating on a node a signal S1 which is delayed relative to the internal supply voltage; and (d) generating the signal CE when the signal S1 reaches a predesignated voltage level, wherein step (c) is performed by a delay circuit comprising a resistor/capacitor circuit coupled between the internal supply voltage and the node, the resistor comprising a first semiconductor region of a first conductivity type forming a PN junction with a second semiconductor region of a second conductivity type, the second semiconductor region receiving the external supply voltage, the method further comprising:

(e) turning off the power supply voltage; and (f) discharging the first semiconductor region through the PN junction and the second semiconductor region.

* * * * *